United States Patent
Harris et al.

(10) Patent No.: US 7,387,737 B2
(45) Date of Patent: *Jun. 17, 2008

(54) METHOD FOR FABRICATING AN ISOLATED MICROELECTROMECHANICAL SYSTEM (MEMS) DEVICE USING AN INTERNAL VOID

(75) Inventors: Richard D. Harris, Solon, OH (US); Robert J. Kretschmann, Bay Village, OH (US); Michael J. Knieser, Richmond Heights, OH (US); Mark A. Lucak, Hudson, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 220 days.

This patent is subject to a terminal disclaimer.

(21) Appl. No.: 11/299,151

(22) Filed: Dec. 9, 2005

(65) Prior Publication Data
US 2006/0096947 A1    May 11, 2006

Related U.S. Application Data

(63) Continuation of application No. 10/862,593, filed on Jun. 7, 2004, now Pat. No. 7,018,550, and a continuation of application No. 09/843,545, filed on Apr. 26, 2001, now Pat. No. 6,761,829.

(51) Int. Cl.
*C23F 1/22* (2006.01)

(52) U.S. Cl. ........................................ 216/2

(58) Field of Classification Search ............ 216/2, 216/11, 33, 36; 438/40, 50, 51, 455, 456, 438/52
See application file for complete search history.

(56) References Cited

U.S. PATENT DOCUMENTS 3,886,447 A    5/1975    Tanaka
(Continued)

FOREIGN PATENT DOCUMENTS

| EP | 0 665 590 A2 | 8/1995 |
| EP | 0 711 029 A2 | 5/1996 |
| EP | 0 763 844 A2 | 3/1997 |

OTHER PUBLICATIONS

Storment, C.W., et al. "Flexible, Dry-Released Process for Aluminum Electrostatic Actuators." Journal of Microelectromechanical Systems, 3(3), Sep. 1994, p. 90-96.
(Continued)

*Primary Examiner*—Roberts Culbert
(74) *Attorney, Agent, or Firm*—Boyle Frederickson LLP; R. Scott Speroff

(57) ABSTRACT

A method for fabricating an electrically isolated MEMS device having an outer stationary MEMS element and an inner movable MEMS element is provided that does not use a sacrificial layer. Rather, a pair of spacers are defined on the outer portions of the upper surface of a conductive wafer, and an insulating material is deposited thereon. The spacers are attached to a substrate to define an internal void therein. The wafer is then patterned to form the outer MEMS element as well as a conductive member for the inner MEMS element, separated from the outer MEMS element by a gap. A portion of the insulating layer that is disposed in the gap is then removed, thereby releasing the inner MEMS element from the stationary MEMS element.

21 Claims, 5 Drawing Sheets

U.S. PATENT DOCUMENTS

| | | |
|---|---|---|
| 4,560,953 A | 12/1985 | Bozio |
| 5,012,207 A | 4/1991 | Edwards |
| 5,025,346 A | 6/1991 | Tang et al. |
| 5,194,819 A | 3/1993 | Briefer |
| 5,243,861 A | 9/1993 | Kloeck et al. |
| 5,343,157 A | 8/1994 | Deschamps |
| 5,359,893 A | 11/1994 | Dunn |
| 5,413,668 A | 5/1995 | Aslam et al. |
| 5,417,312 A | 5/1995 | Tsuchitani et al. |
| 5,424,650 A | 6/1995 | Frick |
| 5,491,604 A | 2/1996 | Nguyen et al. |
| 5,536,988 A | 7/1996 | Zhang et al. |
| 5,563,343 A | 10/1996 | Shaw et al. |
| 5,572,057 A | 11/1996 | Yamamoto et al. |
| 5,578,976 A | 11/1996 | Yao |
| 5,585,311 A | 12/1996 | Ko |
| 5,600,190 A | 2/1997 | Zettler |
| 5,646,432 A | 7/1997 | Iwaki et al. |
| 5,658,698 A | 8/1997 | Yagi et al. |
| 5,761,350 A | 6/1998 | Koh |
| 5,783,340 A | 7/1998 | Farino et al. |
| 5,798,283 A | 8/1998 | Montague et al. |
| 5,804,314 A | 9/1998 | Field et al. |
| 5,815,051 A | 9/1998 | Hamasaki et al. |
| 5,834,864 A | 11/1998 | Hesterman et al. |
| 5,877,038 A | 3/1999 | Coldren et al. |
| 5,903,380 A | 5/1999 | Motamedi et al. |
| 5,920,978 A | 7/1999 | Koshikawa et al. |
| 5,943,155 A | 8/1999 | Goossen |
| 5,955,932 A | 9/1999 | Nguyen et al. |
| 5,959,516 A | 9/1999 | Chang et al. |
| 5,995,688 A | 11/1999 | Aksyuk et al. |
| 6,046,066 A | 4/2000 | Fang et al. |
| 6,060,336 A | 5/2000 | Wan |
| 6,071,426 A | 6/2000 | Lee et al. |
| 6,094,102 A | 7/2000 | Chang et al. |
| 6,100,477 A | 8/2000 | Randall et al. |
| 6,114,794 A | 9/2000 | Dhular et al. |
| 6,116,756 A | 9/2000 | Peeters et al. |
| 6,127,767 A | 10/2000 | Lee et al. |
| 6,137,206 A | 10/2000 | Hill |
| 6,144,545 A | 11/2000 | Lee et al. |
| 6,149,190 A | 11/2000 | Galvin et al. |
| 6,159,385 A | 12/2000 | Yao et al. |
| 6,170,332 B1 | 1/2001 | MacDonald et al. |
| 6,188,322 B1 | 2/2001 | Yao et al. |
| 6,232,150 B1 | 5/2001 | Lin et al. |
| 6,232,841 B1 | 5/2001 | Bartlett et al. |
| 6,232,847 B1 | 5/2001 | Marcy, 5th et al. |
| 6,236,281 B1 | 5/2001 | Nguyen et al. |
| 6,257,705 B1 | 7/2001 | Silverbrook |
| 6,265,238 B1 | 7/2001 | Yaji et al. |
| 6,307,169 B1 | 10/2001 | Sun et al. |
| 6,316,278 B1 | 11/2001 | Jacobsen et al. |
| 6,348,788 B1 | 2/2002 | Yao et al. |
| 6,356,378 B1 | 3/2002 | Huibers |
| 6,356,689 B1 | 3/2002 | Greywall |
| 6,373,682 B1 | 4/2002 | Goodwin-Johansson |
| 6,384,353 B1 | 5/2002 | Huang et al. |
| 6,391,742 B2 | 5/2002 | Kawai |
| 6,400,009 B1 | 6/2002 | Bishop et al. |
| 6,411,214 B1 | 6/2002 | Yao et al. |
| 6,417,743 B1 | 7/2002 | Mihailovich et al. |
| 6,428,713 B1 * | 8/2002 | Christenson et al. .......... 216/2 |
| 6,463,339 B1 | 10/2002 | Vasko |
| 6,465,929 B1 | 10/2002 | Levitan et al. |
| 6,466,005 B1 | 10/2002 | Yao et al. |
| 6,497,141 B1 | 12/2002 | Turner et al. |
| 6,504,356 B2 | 1/2003 | Yao et al. |
| 6,753,638 B2 * | 6/2004 | Adams et al. .............. 310/309 |
| 6,761,829 B2 | 7/2004 | Harris et al. |
| 2002/0011759 A1 | 1/2002 | Adams et al. |
| 2002/0017132 A1 | 2/2002 | McNie et al. |

OTHER PUBLICATIONS

Toumazou, C. et al., n-step Charge Injection Cancellation Scheme for Very Accurate Switched Current Circuits, Electronic Letters, V.30 (9) 680-681: 1994.

Emmerich H., et al., A Novel Micromachined Magnetic-Field Sensor, MEMS 99 IEEE Conference, Jan. 17-21, 1999, IEEE Catalog No. 99ch36291c.

Madou, Marc, Fundamentals of Microfabrication, Chapters 2-4, CRC Press LLC, Boca Raton, FL: 1997.

Kovacs, Gregory T.A., Micromachined Transducers Sourcebook, Table of Contents, pp. 77-119 and Index, WCB McGraw-Hill, U.S.A.: 1998.

Teegarden, Darrell et al., How to Model and Simulate Microgyroscope Systems, IEEE Spectrum, 66-75, Jul. 1998.

Emmerich, Harald et al., Magnetic Field Measurements with a Novel Surface Micromachined Magnetic-Field Sensor, IEEE Transactions on Electron Devices, V. 47 (5) 972-977, May 2000.

McGruer, N.E. et al., Electrostatically Actuated Microswitches; Scaling Properties, Solid-State Sensor and Actuator Workshop, Hilton Head Island, South Carolina, Jun. 8-11, 1998, pp. 132-135.

Miyajima, Hiroshi et al., High-Aspect-Ratio Photolithography for MEMS Applications, J. of Microelectromechanical Sys., V.4(4) 220-229, Dec. 1995.

Lu, Crist et al., A Monolithic Surface Micromachined Accelerometer with Digital Output, IEEE J. of Solid State Circuits, V. 30 (12) 1367-1373, Dec. 1995.

Chen, Ming-Jer et al., Weak Inversion Charge Injection in Analog MOS Switches, IEEE J. of Solid-State Circuits, V. 30 (5) 604-606, May 1995.

Lemkin, Mark A. et al., A Fully Differential Lateral Accelerometer with Drift Cancellation Circuitry, Solid-State Sensor and Actuator Workshop, Hilton Head, South Carolina, Jun. 2-6, 1996, pp. 90-93.

Boser, Bernhard E. et al., Surface Micromachined Accelerometers, IEEE J. of Solid-State Circuits, V. 31 (3) 366-375, Mar. 1996.

Fedder, Gary K. et al., Multimode Digital Control of a Suspended Polysilicon Microstructure, J. of Microelectromechanical Sys., V. 5 (4) 283-297, Dec. 1996.

Noriega, Gerardo, Sigma-Delta A/D Converters-Audio and Medium Bandwidths, Technical Notes-DT3 from RMS Instruments website: www.rmsinst.com, 6 pages, Feb. 1996.

Internet page: Decimator Filter DLL, NeuroDimension Inc.: www.nd.com, May 31, 2001.

U.S. Appl. No. 09/406,654, filed Sep. 27, 1999.
U.S. Appl. No. 09/400,125, filed Sep. 21, 1999.
U.S. Appl. No. 09/406,509, filed Sep. 28, 1999.
U.S. Appl. No. 09/955,493, filed Sep. 18, 2001.
U.S. Appl. No. 09/955,494, filed Sep. 18, 2001.
U.S. Appl. No. 09/675,861, filed Sep. 29, 2000.

* cited by examiner

METHOD FOR FABRICATING AN ISOLATED MICROELECTROMECHANICAL SYSTEM (MEMS) DEVICE USING AN INTERNAL VOID

CROSS-REFERENCE TO RELATED APPLICATIONS

This is a Continuation of U.S. patent application Ser. No. 09/843,545, filed Apr. 26, 2001, and issued as U.S. Pat. No. 6,761,829 and U.S. patent application Ser. No. 10/862,593 filed Jun. 7, 2004 now U.S. Pat. No. 7,018,550, the disclosures of which is hereby incorporated by reference as if set forth in their entirety herein.

BACKGROUND OF THE INVENTION

1. Field of the Invention

The present invention relates to microelectromechanical systems (MEMS) and, in particular, relates to the fabrication of MEMS devices using an internal void.

2. Discussion of the Related Art

Microelectromechanical systems (MEMS) components are being progressively introduced into many electronic circuit as well as micro-sensor applications. Examples of MEMS components are electromechanical motors, radio frequency (RF) switches, high Q capacitors, pressure transducers and accelerometers. In one application, the MEMS device is an accelerometer having a movable component that, in response to an external stimulus, is actuated so as to vary the size of a capacitive air gap. Accordingly, the capacitance output of the MEMS device provides an indication of the strength of the acceleration.

When the MEMS device is an accelerometer, the device comprises a stationary MEMS element that is attached to a nonconductive substrate, and a movable MEMS element that has a substantial portion that is free from mechanical contact with the substrate that is therefore movable with respect to the stationary element.

One method of fabricating such components, often referred to as surface micro-machining, uses a sacrificial layer, such as silicon dioxide, that is deposited and bonded onto a substrate, such as single crystal silicon which has been covered with a layer of silicon nitride. A MEMS component material, for example polycrystalline silicon, is then deposited on the sacrificial layer, followed by a suitable conductor, such as aluminum, to form an electrical contact with the ambient environment. The silicon layer is then patterned by standard photolithographic techniques and then etched by a suitable reactive ion etching plasma or by wet chemistry to define the MEMS structure and to expose the sacrificial layer, which may comprise silicon dioxide. The sacrificial layer is then etched to release the MEMS component.

Several disadvantages are associated with fabricating a MEMS device using a sacrificial layer. First, it requires the availability of an etching process that is capable of selectively etching the sacrificial layer without reacting with the other materials that will ultimately form the MEMS device. This limits the materials that may be used when fabricating the MEMS device. Additionally, the use of a sacrificial layer increases the amount of materials needed to form the MEMS device, thereby adding cost and complexity to the fabrication process. Furthermore, an additional etching step is needed to remove the sacrificial layer, thereby further reducing the efficiency of the fabrication process. In particular, because the structure forming the movable MEMS element is disposed on top of the sacrificial layer, a significant amount of time is needed to completely undercut the sacrificial layer. In fact, in some instances, holes are first etched through the base of the movable MEMS element in order to permit the etchant to access the sacrificial layer.

What is therefore needed is an improved method for manufacturing isolated MEMS devices using simplified etching processes that avoids the disadvantages associated with undercutting a sacrificial layer to release the movable MEMS element.

BRIEF SUMMARY OF THE INVENTION

The present inventors have recognized that an internal void may be formed while fabricating a MEMS device that facilitates the release of the movable MEMS element from the substrate while avoiding the difficulties associated with using a sacrificial layer.

In accordance with one aspect of the invention, a method for fabricating a MEMS device onto a substrate having a movable MEMS element portion free from the substrate and disposed adjacent a stationary MEMS element that is in mechanical communication with the substrate, comprises the steps of providing a wafer having opposed first and second surfaces, forming a recess into the first surface to produce a spacer member disposed at a periphery of the recess, mechanically connecting the spacer member to the substrate to form an internal void from the recess, wherein the void is further defined by the substrate, and removing a portion of the wafer into the void so as to release the movable MEMS element from the stationary MEMS element.

These and other aspects of the invention are not intended to define the scope of the invention for which purpose claims are provided. In the following description, reference is made to the accompanying drawings, which form a part hereof, and in which there is shown by way of illustration, and not limitation, a preferred embodiment of the invention. Such embodiment does not define the scope of the invention and reference must be made therefore to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE INVENTION

Figure 1:
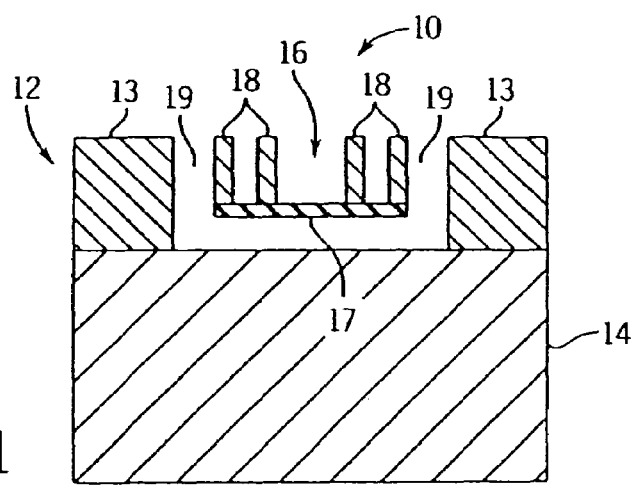
FIG. 1 is a schematic sectional side elevation view of a MEMS device.

Referring initially to FIG. 1, a schematic illustration of a MEMS device 10 includes a stationary MEMS element 12, which comprises a pair of stationary outer conductive members 13 extending upwardly from a substrate 14. The substrate 14 may be either conducting or insulating, depending on the intended application, and may comprise glass, high resistivity silicon, crystalline sapphire, crystalline silicon, polycrystalline silicon, silicon carbide, or ceramic such as alumina, aluminum nitride, and the like, or gallium arsenide. In fact, the substrate may comprise any material whatsoever that is suitable for supporting a MEMS device. An inner movable MEMS element 16 is disposed between the pair of stationary members 13, and includes a base layer 17 supporting two pairs of separated conductive elements 18 that extend upwardly from the base. It should be appreciated by those having ordinary skill in the art that movable MEMS element 16 is a beam that is supported at its distal ends by, for example, the substrate such that the middle portion of element 16 is free and movable relative to the stationary members 13. The outer two elements 13 are separated from moveable MEMS element 16 by a variable size gap 19, which could be the gap between the adjacent plates of a detection capacitor, as will become more apparent from the description below.

The MEMS device 10 could therefore perform any function suitable for a MEMS application. For example, the device could comprise an accelerometer whose movable MEMS element 16 is a beam that deflects in response to the external stimulus, such as an acceleration or vibration of the device 10. Accordingly, as the size of the gaps 19 vary, so will the output capacitance, thereby providing a measurement of the amount of deflection of the movable MEMS element 16. A measurement of the amount of acceleration may thereby be obtained by measuring the capacitance of the device. The device 10 constructed in accordance with the present invention could further incorporate a wafer level cap and electrical traces connected to the stationary members 13, as described in "Method for Fabricating an Insolated Microelectromechanical System (MEMS) Device Incorporating a Wafer Level Cap" filed on even date herewith, the disclosure of which is hereby incorporated by reference.

If base layer 17 is formed utilizing an insulating material, as is the case in accordance with the preferred embodiment, the conductive elements 18 become electrically isolated from each other, thereby minimizing the risk that an electrical input will conduct across the device 10, which would jeopardize those elements disposed downstream of the MEMS output.

The MEMS device 10 may be fabricated in accordance with several embodiments that utilize an internal void to release the movable MEMS element 16 from the substrate 14 and stationary elements 13, as will now be described.

Figure 2:
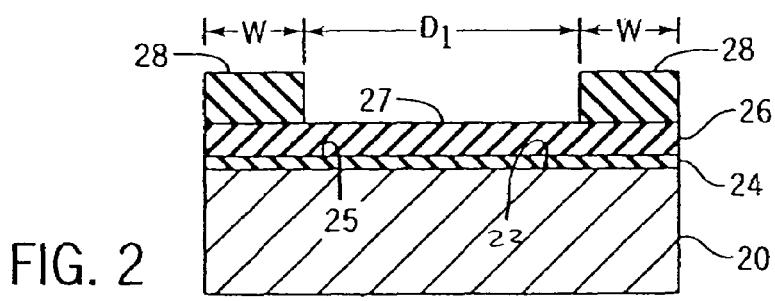
FIG. 2 is a sectional side elevation view of a wafer having a first and a second layer deposited thereon, and having photoresist deposited thereon and patterned, and usable to fabricate a MEMS device in accordance with a preferred embodiment.

In particular, referring now to FIG. 2, a wafer 20, which is conducting and comprises silicon in accordance with the preferred embodiment, includes a first layer 24 deposited onto the upper surface 22 thereof. The first layer 24 is insulating in accordance with the preferred embodiment, and comprises silicon oxide ($SiO_2$). The oxide layer 24 may be formed by thermal oxidization of the wafer 20, or by depositing a layer of silicon dioxide, for example by using chemical vapor deposition (CVD) or plasma enhanced chemical vapor deposition (PECVD), as is understood by those having ordinary skill in the art.

Alternatively, the combination of wafer 20 and first insulating layer 24 could be realized using a silicon-on-insulator (SOI) wafer, in which the insulating layer would comprise silicon dioxide that is deposited onto the top surface of the SOI wafer 20 as commercially available. SOI wafers are commercially available having various thicknesses, and are thus selected in anticipation of the height of the final MEMS device. A method of etching a SOI wafer is described in a patent application filed on even date herewith and entitled "Method for Fabricating a Microelectromechanical System (MEMS) Device Using a Pre-patterned Substrate" the disclosure of which is hereby incorporated by reference.

Next, a second layer 26 is deposited onto the oxide layer 24 using chemical vapor deposition, plasma enhanced chemical vapor deposition, or like method. Because the layer 26 will ultimately provide a spacer that will be used to define an internal void during fabrication, as will be described below, and will not ultimately form part of the inner movable MEMS element 16, this layer could comprise either an insulating or conductive material, so long as it is selectively etchable from the other materials forming the MEMS device 10. The second layer 26 may comprise, for example, either silicon nitride ($Si_3N_4$) or polycrystalline silicon in accordance with the preferred embodiment. However, if the substrate 14 (shown in FIG. 3) is conductive, it may be desirable for the second layer 26 to be insulating to achieve electrical isolation for the device 10. Because insulating layer 24 will ultimately form the base of the fabricated movable MEMS element 16, the MEMS device 10 may achieve sufficient electrical isolation, as will become more apparent from the description below. It should be appreciated, however, that layer 24 need not be constructed with an insulating material if electrical isolation is not desired.

It should further be appreciated that the embodiments described herein comprise various layers of conductive and nonconductive materials. While these materials are identified in accordance with the preferred embodiment, it should be appreciated that any alternative materials suitable for use in the intended MEMS application, and that are selectively etchable if necessary, could be substituted for the disclosed materials. For example, layer 24 could be silicon nitride and layer 26 could be silicon dioxide.

A pair of photoresist members 28 is formed by depositing photoresist on the upper surface 27 of the second layer 26 and patterning it using standard photolithographic techniques. The pair is spaced apart by a middle section having a distance $D_1$ which defines the width of an internal void that will facilitate the release of the fabricated inner movable MEMS element, as will become more apparent from the description below. It will become further apparent that the width W of each photoresist member 28 could correspond to the width of the fabricated stationary outer conductive members 13 and, in any event, will define the width of spacer member 29 (shown in FIG. 3) as will now be described.

The second layer 26 is selectively etched, using either phosphoric acid, $H_3PO_4$ as a wet chemistry etch or a $CF_4$ + 4%$O_2$ plasma as a dry etch, to remove the portion of silicon nitride that is disposed between the photoresist members 28, while avoiding that disposed directly beneath the photoresist. Accordingly, a pair of spacers 29 is formed on the outer ends of the upper surface 25 of layer 24, defining a recess 30 therebetween whose base is further defined by upper surface 25.

Figure 3:
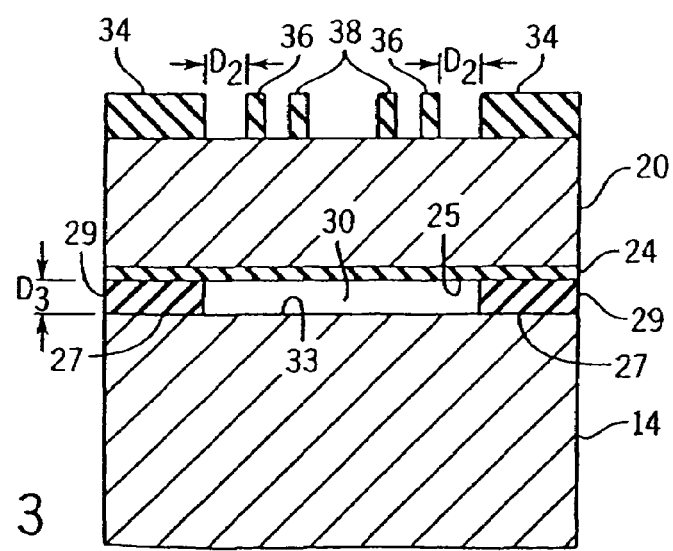
FIG. 3 is a sectional side elevation view of the wafer illustrated in FIG. 2 after selectively etching the second layer and bonding the wafer to a substrate to form a composite structure and after depositing and patterning photoresist onto the composite structure.

Next, referring to FIG. 3, the remaining photoresist 28 is removed to expose the spacers 29, whose upper surface 27 is bonded to the upper surface 33 of the substrate 14 using a high temperature fusion bonding or any equivalent process as understood by those having ordinary skill in the art. Accordingly, an internal void is formed from the recess 30 that is further defined by the upper surface 33. The height $D_3$ of the spacer member 29 defines the height of the void 30, which should be sufficiently great to allow the release of the inner movable MEMS element 16 without the need to undercut a sacrificial layer that would be disposed beneath the movable MEMS element in accordance with conventional fabrication processes.

Wafer 20 may next be thinned to the desired thickness of the final MEMS device. If the wafer 20 is an SOI wafer, where the top silicon layer has been pre-selected to have the correct thickness for the MEMS device, the back silicon portion is largely removed by a grind and polish step, with the remaining portion, up to the silicon dioxide layer, removed by a chemical etch, such as TMAH. Next the silicon dioxide layer is removed in an HF etch. The silicon that remains would then have the desired thickness of the final MEMS device. If the original wafer 20 is a solid silicon wafer, then it must be carefully thinned to the desired thickness by a combination of physical grinding and polishing steps and chemical etching steps, taking care to maintain a uniform thickness across the entirety of the wafer.

Still referring to FIG. 3, photoresist members are now formed on the exposed surface of the silicon wafer 20 by depositing the photoresist and patterning with standard photolithographic techniques. In particular, a pair of outer photoresist members 34 are formed at the outer ends of the silicon wafer 20 and aligned with the spacers 29 to ultimately form the stationary outer MEMS element, as will become more apparent from the description below. A pair of middle photoresist members 36 are formed inwardly of outer pair 34 by a distance $D_2$ that will ultimately define a variable size gap disposed between the fabricated inner movable MEMS element and the stationary MEMS element. An inner pair of photoresist members 38 is formed on the wafer 20, and spaced inwardly therefrom, such that the silicon disposed beneath photoresist 36 and 38 will ultimately define conductive structures on the movable MEMS element.

Figure 4A:
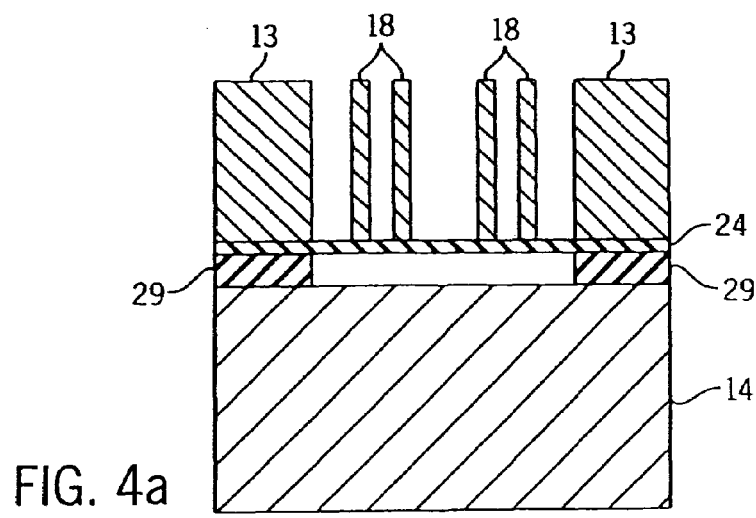
FIG. 4A is a sectional side elevation view of the composite structure illustrated in FIG. 3 after selectively etching the wafer and removing the photoresist.

With the photoresist 34, 36, and 38 in place, the silicon wafer 20 is anisotropically dry etched in an inductively coupled plasma (ICP), as is understood by those having ordinary skill in the art. This etching process removes all silicon not disposed directly beneath one of the photoresist members to expose that portion of silicon dioxide layer 24 that is aligned with the etched silicon. The photoresist 34, 36, and 38 is then removed to reveal the inner and outer pairs of conductive elements 18 that extend upwardly from the silicon dioxide layer 24, as shown in FIG. 4A. Because the conductive elements 18 are aligned with the internal void 30, they will form part of the fabricated inner movable MEMS element 16. A third pair of oppositely disposed conductive elements 13 are formed, and are aligned with and are connected to the remaining spacers 29. Elements 13 are thus also connected to substrate 14 and will form part of the stationary conductive members 13 of the stationary MEMS element 12, as will now be described. At this point, the portion of conductive elements 18 that is disposed sufficiently inward of the distal end is only mechanically connected to stationary conductive members 13 via the silicon dioxide layer 24, it being appreciated that the elements are connected to the substrate 14 at their distal ends. Such an arrangement is described, for example in a patent application filed on Mar. 13, 2001 and entitled "Microelectricalmechanical System (MEMS) Electrical Isolator with Reduced Sensitivity to Internal Noise" the disclosure of which is hereby incorporated by reference.

Figure 4B:
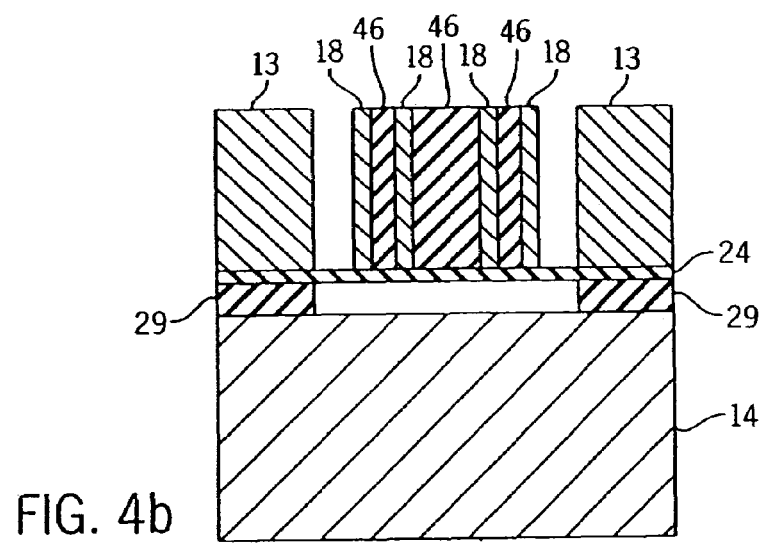
FIG. 4B is a sectional side elevation view of the composite structure illustrated in FIG. 4A after depositing and patterning additional photoresist.

Referring now to FIG. 4B, photoresist 46 is deposited onto the structure and photolithographically patterned so as to protect that portion of the silicon dioxide layer 24 that is exposed between the conductive elements 18.

Figure 5:
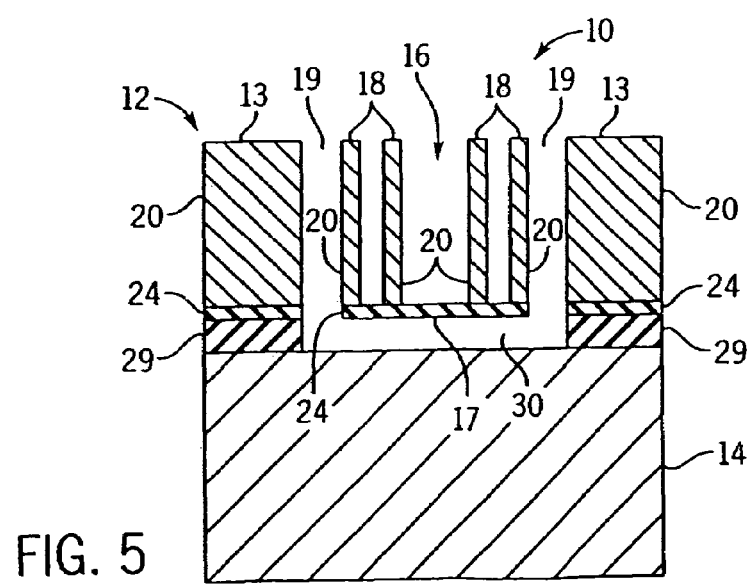
FIG. 5 is a sectional side elevation view of a MEMS device formed after selectively etching the first layer of the composite structure illustrated in FIG. 4B and removing the photoresist.

Accordingly, referring also to FIG. 5, only the silicon dioxide that is disposed between conductive elements 18 and 13, where it is not protected by the photoresist, is removed by applying to the exposed silicon dioxide an anisotropic etching plasma, such as trifluoro-methane ($CHF_3$), commercially known as fluoroform. The photoresist 46 is subsequently removed. Because the etched silicon dioxide is aligned with the internal void 30, and the layer 24 is etched into the void 30, the inner movable MEMS element 16 is released from the stationary element 12. In particular, the inner movable MEMS element 16 comprises the plurality of the conductive elements 18 that are spaced from each other, and connected via the insulating silicon dioxide base 17 to provide electrical isolation for the device 12. The outermost conductive elements 18, comprising the silicon 20, silicon dioxide 24, and silicon nitride or polycrystalline silicon 29 layers, are separated from the corresponding stationary conductive elements 13 via the variable size gap 19 so as to output an electrical signal whose strength is dependent on the size of the gap in response to movement by the inner MEMS element 16.

It should be appreciated that the primary purpose of insulating layer 24 is to form the top of the internal void 30 and, subsequently, the base 17 of the inner movable MEMS element 16. Accordingly, it need not be present on the outer sections of the wafer 20 adjacent the middle section in accordance with the preferred embodiment, but is deposited onto the entire wafer 20 for ease of deposition. In this regard, however, it should be appreciated that the outer conductive members 13 need not include the insulating layer 24.

Figure 6:
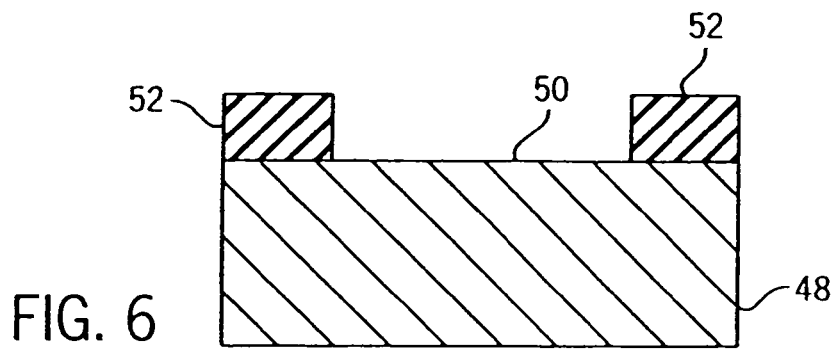
FIG. 6 is a sectional side elevation view of a wafer, showing patterned photoresist, used to construct a MEMS device in accordance with an alternate embodiment of the invention.

Referring now to FIG. 6, a method of manufacturing the MEMS device 10 in accordance with an alternate embodiment begins with a wafer 48, which preferably comprises silicon, or an SOI waver, as described above. A pair of outer photoresist members 52 is formed on the upper surface 50 of the wafer 48, and the wafer is subsequently anisotropically dry etched in an inductively coupled plasma (ICP). It should be appreciated that the width of each photoresist member 52 will define the corresponding width of the spacers, and consequently the width of the fabricated stationary conductive MEMS elements 13, as will become more apparent from the description below.

Figure 7:
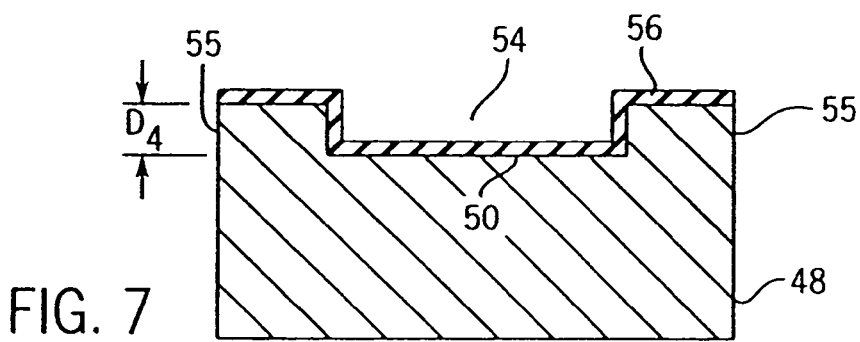
FIG. 7 is a sectional side elevation view of the composite structure illustrated in FIG. 6 after selectively etching the wafer, removing the photoresist, and depositing a separating layer.

The middle portion of wafer 48 is partially etched for a predetermined amount of time sufficient to produce an outer pair of spacers 55 having a recess 54 therebetween of a depth $D_4$ (shown in FIG. 7). The etchant and photoresist 52 are subsequently removed once the recess 54 has achieved a sufficient depth. Depth $D_4$ should be sufficiently large to produce an internal void once the wafer is bonded to the substrate 14, and to enable the movable MEMS element 16 to be subsequently released from the substrate 48, as will be described in more detail below. It should be appreciated that the thickness of the final MEMS structure is the original thickness of the SOI wafer minus $D_4$. Accordingly, $D_4$ is controlled to determine the final thickness of the fabricated MEMS device 10 and, accordingly, the magnitude of the resulting electrical signal.

Referring now to FIG. 7, layer 56, which is insulating in accordance with the preferred embodiment, is applied to the upper surface 50 of the wafer. The insulating properties of layer 56 will provide the electrical isolation for the fabricated MEMS device 10. The layer 56 preferably comprises silicon dioxide, but could alternatively comprise a selectively etchable material having suitable properties, such as silicon nitride, for example. The layer 56 may be formed using a standard oxidation process in which the wafer 48 is exposed to elevated temperatures in an oxygen atmosphere for a predetermined period of time. Alternatively, the layer 56 may be deposited using chemical vapor deposition or plasma enhanced chemical vapor deposition, which would be preferable if it is desirable to reduce the temperatures experienced by the wafer 48. It is appreciated that the layer 56 is continuous where in alignment with the recess, as this portion of the layer will ultimately define the base 17 of the inner movable MEMS element 16.

Figure 8:
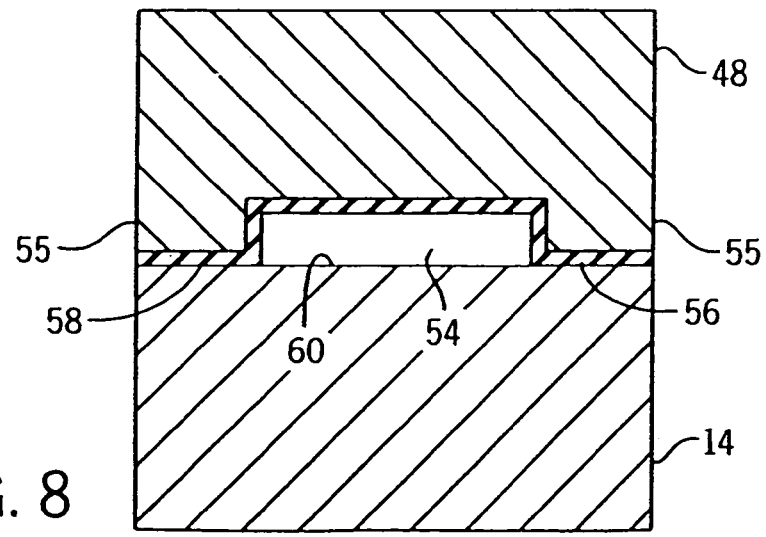
FIG. 8 is a sectional side elevation view of the wafer illustrated in FIG. 7 bonded to a substrate to form a composite structure.

In accordance with the illustrated embodiment, the spacers 55 comprise the portion of the unetched silicon at the outer ends of the wafer 48. The layer 56 may not provide a useful function for the spacers 55 if the substrate 14, shown in FIG. 8, is an insulator. It should therefore be understood that the spacers 55 need not include the insulating layer 56 formed thereon to provide the recess 54 in accordance with the preferred embodiment. If the substrate is a conductor, however, then the insulating properties associated with layer 56 may be necessary to provide electrical isolation for the device 10. For the purposes of clarity and convenience, spacers 55, as used herein, will include layer 56 throughout this description, it being appreciated that layer 56 need not form part of spacers 55 as described above.

Referring to FIG. 8, the upper surfaces 58 of spacers 55 are bonded to the upper surface 60 of substrate 14 using a high temperature fusion bonding, or any equivalent process, as described above. Accordingly, the recess 54 becomes an internal void that is further defined by the upper surface 60 of the substrate 14. Additionally, the portion of the wafer 48 that is aligned with the portion of layer 56 that is bonded to the substrate 14 will ultimately comprise the stationary outer conductive elements 13, as will now be described.

Wafer 48 is then thinned to the desired thickness of the final MEMS device 10. If the wafer 48 is an SOI wafer, where the top silicon layer is the correct thickness for the MEMS device, the back silicon portion is largely removed by a grind and polish step, with the remaining portion, up to the silicon dioxide layer, removed by a chemical etch, such as TMAH. Next the silicon dioxide layer is removed in an HF etch. The remaining silicon is now the desired thickness of the final MEMS device. If the original wafer 48 is a solid silicon wafer, then it must be carefully thinned to the desired thickness by a combination of physical grinding and polishing steps and chemical etching steps, taking care to maintain a uniform thickness across the entirety of the wafer.

Figure 9:
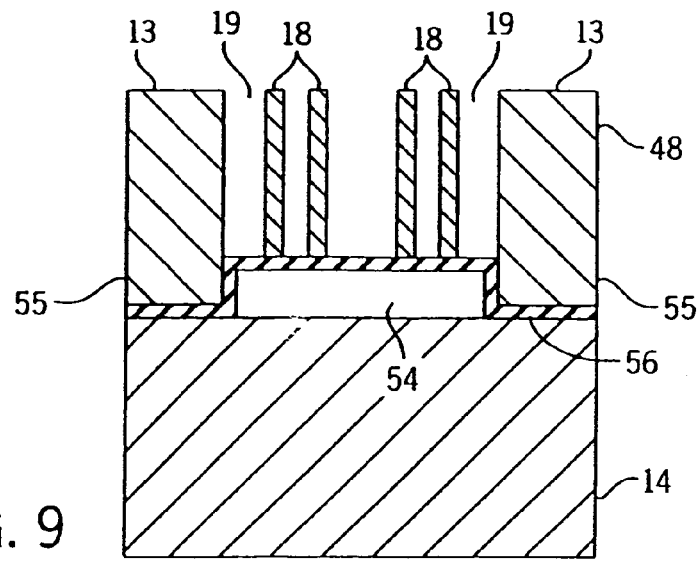
FIG. 9 is a sectional side elevation view of the composite structure illustrated in FIG. 8 after further selectively etching the wafer.

Next, referring to FIG. 9, photoresist is applied and patterned to the silicon wafer 48, which is then anisotropically etched down to the separating layer 56, as described above with reference to FIGS. 3 and 4A. Accordingly, a pair of outer conductive elements 13 are formed along with inner conductive elements 18, which are supported by separating layer 56. As described above, conductive elements 18 and separator 56 will ultimately define the base of inner movable MEMS element 16. The outer conductive elements 18 are separated from the outer pair of inner conductive elements by a variable size gap 19. The final step in the fabrication process is to form the inner movable MEMS element 16. In particular, photoresist is applied and patterned so as to remain on that portion of layer 56 that is disposed between the conductive elements 18 and to expose only that portion of the layer that is aligned with the variable size gap 19.

Figure 10:
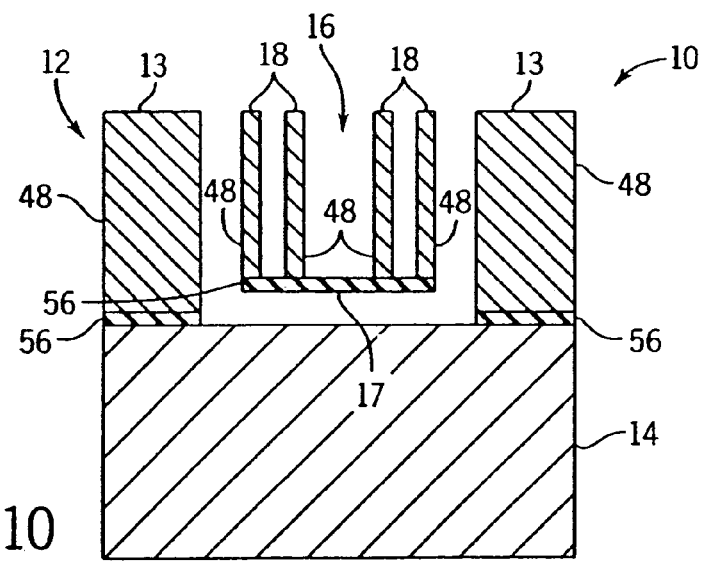
FIG. 10 is sectional side elevation view of a MEMS device formed after selectively etching the separating layer of the composite structure illustrated in FIG. 9.

Referring now to FIG. 10, the structure is processed for a sufficient amount of time to anisotropically etch all of the material comprising the exposed portion of layer 56, thereby releasing the inner movable MEMS element 16 from the stationary element 12. In particular, the inner movable MEMS element 16 comprises the plurality of the conductive elements 18 spaced apart from one another, and connected via the insulating silicon dioxide base 17 to provide electrical isolation in accordance with the preferred embodiment. The outermost conductive elements 18, comprising the silicon 48 and silicon dioxide 56, are separated from the corresponding stationary conductive elements 13 via the variable size gap 19 so as to output an electrical signal whose strength is dependent on the size of the gap in response to movement by the inner MEMS element 16.

Figure 11:
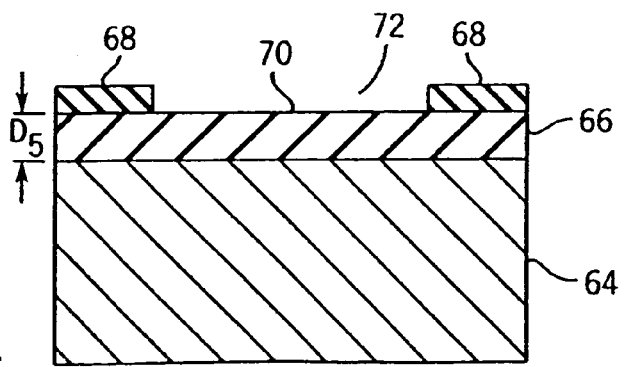
FIG. 11 is a sectional side elevation view of a wafer having a first separating layer deposited thereon, and having photoresist deposited and patterned thereon, and used to construct a MEMS device in accordance with another alternate embodiment.

Referring now to FIG. 11, a method of manufacturing the MEMS device 10 in accordance with an alternate embodiment is presented that avoids the difficulties associated with partially etching the silicon material. In particular, a silicon wafer 64 has deposited thereon a first layer 66, which may or may not be insulating. In accordance with the preferred embodiment, the layer comprises silicon dioxide because it is easily selectively etchable, it being appreciated that layer 66 could alternatively comprise any other selectively etchable material, such as silicon nitride. The thickness $D_5$ of layer 66 will define the depth of the corresponding internal void, and should be sufficiently deep so as to facilitate the release of the inner movable MEMS element from the substrate. Photoresist members 68 are formed on the outer ends of the upper surface 70 of layer 66 whose width will, as described above, correspond to the width of the fabricated spacers.

Figure 12:
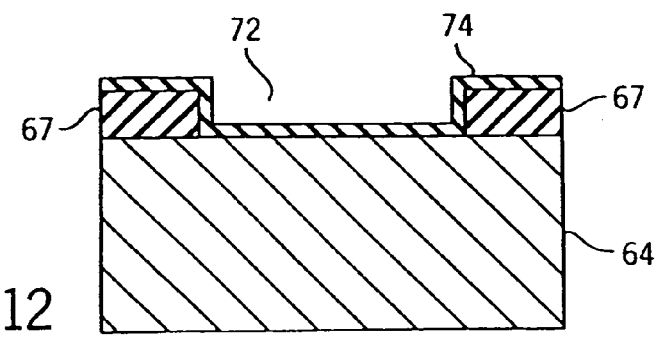
FIG. 12 is a sectional side elevation view of the wafer illustrated in FIG. 11 after selectively etching the first separating layer, removing the photoresist, and depositing a second separating layer thereon.

Referring now to FIG. 12, layer 66 is isotropically etched, and the photoresist 68 is removed, to reveal an outer pair of spacers 67 defining a recess 72 therebetween. Next, a second layer 74, which in the preferred embodiment comprises an insulator such as silicon dioxide, is deposited onto the wafer 64 and spacers 67. As described above, however, it should be appreciated that the spacers do not necessarily need to include the layer 74 that is disposed thereon unless layer 74 is needed to achieve electrical isolation.

It should be appreciated that while both layers 66 and 74 are formed from the same material in accordance with this embodiment, such an arrangement is feasible because the layers are not selectively etched with respect to one another. Rather, both layers 66 and 74 will be selectively etched with respect to the silicon wafer 64, as will be described in more detail below.

Figure 13:
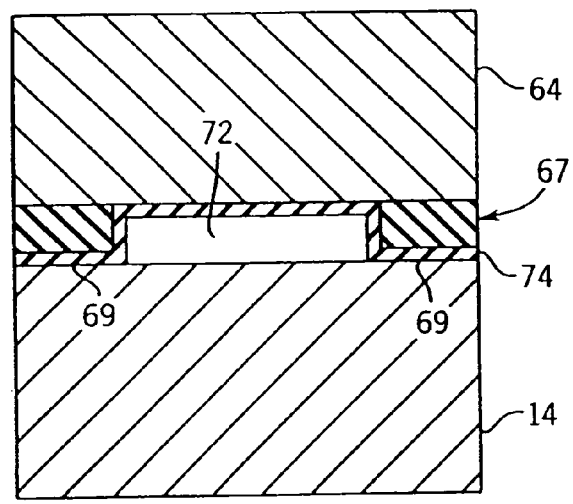
FIG. 13 is a sectional side elevation view of the wafer illustrated in FIG. 12 bonded to a substrate to form a composite structure.
Figure 14:
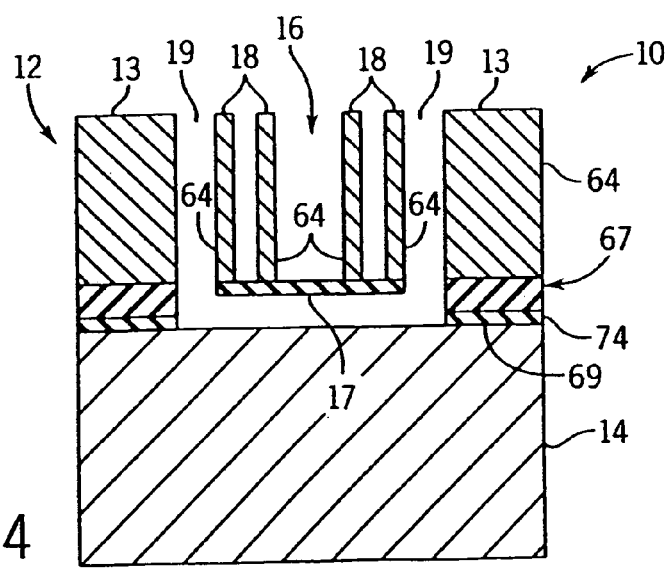
FIG. 14 is a sectional side elevation view of a MEMS device after selectively etching the wafer and the second separating layer of the composite structure illustrated in FIG. 13.

Referring now to FIGS. 13 and 14, the upper surfaces 69 of spacers 67 are bonded to the upper surface of the insulating substrate 14. Next, as described above with reference to FIGS. 9 and 10, the wafer 64 is thinned, patterned, and etched to produce the outer stationary conductive elements 13 and inner movable conductive elements 18. Finally, the portion of the layer 74 that is aligned with the variable size gap 19 is etched to release the inner movable MEMS element 16 from the stationary element 12.

The above has been described as preferred embodiments of the present invention. It will occur to those that practice the art that many modifications may be made without departing from the spirit and scope of the invention. For example, it is appreciated by one having ordinary skill in the art that the structure of the inner movable MEMS element 16 may differ so long as it is electrically isolated and includes a conductive member that is operable to create a capacitance that varies according to. Accordingly, variations of the embodiments described herein will become apparent to those having ordinary skill in the art, and such variations are within the scope of the present invention, as defined by the following claims.

We claim:

1. A method of fabricating a circuit device comprising the steps of:
    (a) providing a wafer and a substrate;
    (b) depositing a first layer on the wafer;
    (c) depositing a spacer material directly onto the first layer without first etching the first layer;
    (d) etching through the spacer material to the first layer to form a recess within a middle portion of the spacer material using an etchant that preferentially etches the spacer material without etching the first layer;
    (e) attaching the spacer material to the substrate without an intermediary adhesive layer to form a composite structure having a void disposed therein; and
    (f) etching into the wafer towards the substrate to remove a portion of the wafer and release a movable element.

2. The method of claim 1 wherein the moveable element is a microelectromechanical system (MEMS) device.

3. The method of claim 1 wherein step (d) is performed without the use of a sacrificial layer arranged between the spacer material and the first layer.

4. The method of claim 1 wherein step (f) further comprises forming a gap between the movable element and the substrate, the gap being at least partially aligned with the void.

5. The method of claim 4 wherein the gap has a size that varies in response to movement by the movable element.

6. The method of claim 4 wherein step (c) further comprises producing first and second conductive elements associated with the substrate that are electrically isolated from each other.

7. A metod of fabricating a circuit device comprising the steps of:
    (a) providing a wafer and a substrate;
    (b) depositing a first layer on the wafer;
    (c) depositing a spacer material directly onto the first layer;
    (d) etching through the spacer material to the first layer to form a recess within a middle portion of the spacer material using an etchant that preferentially etches the spacer materlal without etching the first layer;
    (e) attaching the spacer material to the substrate to form composite structure having a void disposed therein ; and
    (f) etching into the wafer toward the substrate to remove a portion of the wafer and release a movable element,
    wherein step (d) further comprises depositing an insulating layer onto the wafer in the recess.

8. The method of claim 7 wherein the insulating layer is selected from the group consisting of silicon nitride and silicon dioxide.

9. The method of claim 1 wherein the wafer is conductive.

10. The method of claim 1 wherein the substrate is conductive.

11. The method of claim 1 wherein the spacer material is an insulator.

12. The method of claim 1 wherein the substrate is selected from the group consisting of glass, high resistivity silicon, crystalline sapphire, and ceramic.

13. The method of claim 1 wherein the substrate is nonconductive.

14. The method of claim 13 wherein to substrate is selected from to group consisting of silicon, silicon carbide, and gallium arsenide.

15. The method of claim 14 wherein the wafer comprises silicon.

16. A method of fabricating a circuit device comprising the steps of:
    (a) providing a wafer and a substrate;
    (b) partially etching a middle portion of the wafer so as to form a recess in the middle portion of the wafter;
    (c) depositing a first layer on the partially etched wafer, wherein the first layer is formed over the recess;
    (d) attaching the first layer to the substrate such that a void is disposed between the substrate and the first layer;
    (e) forming a movable element in the wafer; and
    (f) etching into the wafer towards the substrate to remove a portion of the wafer and the first layer to release the movable element.

17. The method of claim 16 wherein the moveable element is a MEMS device.

18. The method of claim 16 wherein the movable element comprises a plurality of conductive elements electrically isolated from one another by the first layer, wherein the first layer is an insulator.

19. The method of claim 16 wherein step (f) further comprises forming a gap between the movable element and the substrate, the gap being at least partially aligned with the void.

20. The method of claim 19 wherein step (c) further comprises producing first and second conductive elements associated with the substrate that are electrically isolated from each other.

21. A method of fabricating a circuit device comprising the steps of:
(a) providing a wafer and a substrate;
(b) depositing a first layer on the wafer;
(c) depositing a spacer material on the first layer;
(d) selectively etching the first layer independently from selectively etching the spacer material without a sacrificial layer disposed between the first layer and the spacer material to form a recess within a middle portion of the spacer material;
(e) attaching the spacer material to the substrate to form a composite structure having a void disposed therein; and
(f) etching into the wafer towards the substrate to remove a portion of the wafer and release a movable element,
wherein step (d) further comprises depositing an insulating layer onto the wafer in the recess.

* * * * *